United States Patent
Yoo

(10) Patent No.: US 9,479,719 B2
(45) Date of Patent: Oct. 25, 2016

(54) IMAGE SENSING DEVICE HAVING INPUT/OUTPUT LINES

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 14/305,915

(22) Filed: Jun. 16, 2014

(65) Prior Publication Data

US 2015/0181143 A1  Jun. 25, 2015

(30) Foreign Application Priority Data

Dec. 20, 2013 (KR) .................. 10-2013-0160394

(51) Int. Cl.
   *H04N 5/378* (2011.01)
   *H01L 27/146* (2006.01)
   *H04N 9/04* (2006.01)

(52) U.S. Cl.
   CPC ........ *H04N 5/378* (2013.01); *H01L 27/14603* (2013.01); *H04N 9/045* (2013.01)

(58) Field of Classification Search
   CPC .............. H04N 5/374–5/378; H04N 9/045; H01L 27/14603–27/14605
   See application file for complete search history.

(56) References Cited

U.S. PATENT DOCUMENTS

| 6,801,258 B1 * | 10/2004 | Pain ............... H04N 3/1562 250/208.1 |
| 6,876,388 B1 | 4/2005 | Lee et al. |
| 2010/0141812 A1 * | 6/2010 | Hirota ............ H04N 9/045 348/279 |
| 2011/0037884 A1 * | 2/2011 | Hiyama ........... H04N 3/155 348/300 |
| 2012/0307097 A1 * | 12/2012 | Araoka ........... H04N 5/378 348/222.1 |
| 2012/0307120 A1 | 12/2012 | Ito et al. |

* cited by examiner

*Primary Examiner* — Dennis Hogue
(74) *Attorney, Agent, or Firm* — IP & T Group LLP

(57) ABSTRACT

An image sensing device includes a first read unit suitable for generating a first read signal by reading a first pixel signal, a first input line suitable for transmitting the first pixel signal, a first feedback line suitable for feeding back the first read signal, a second read unit disposed adjacent to the first read unit in a same row and suitable for generating a second read signal by reading a second pixel signal, a second input line suitable for transmitting the second pixel signal, and a second feedback line suitable for feeding back the second read signal wherein the first input line and the first feedback line are disposed symmetrically to the second input line and the second feedback line.

18 Claims, 4 Drawing Sheets

IMAGE SENSING DEVICE HAVING INPUT/OUTPUT LINES

CROSS-REFERENCE TO RELATED APPLICATIONS

The present application claims priority of Korean Patent Application No. 10-2013-0160394, filed on Dec. 20, 2013, which is incorporated herein by reference in its entirety.

BACKGROUND

1. Field

Exemplary embodiments of the present invention relate to semiconductor design technology, and, more particularly, to an image sensing device.

2. Description of the Related Art

In general, an image sensing device refers to a device that captures an image by using a semiconductor with properties that respond to incident light. Charge Coupled Device (CCD) technology has been widely used for image sensing devices. However, as Complementary Metal Oxide Semiconductor (CMOS) technology has rapidly progressed, an image sensing device using CMOS technology (which is referred to as a CMOS image sensing device, hereinafter) developed. Compared to typical Charge Coupled Device (CCD) technology, the CMOS image sensing device has an advantage in that analog and digital control circuits may be directly implemented as an integrated circuit (IC) on a single chip.

A CMOS image sensing device has as many comparators as the number of columns in its pixel array. The comparators convert pixel signals outputted from pixels arranged in each row into digital signals. The comparator compares the pixel signal with a ramp signal to output the digital signal that is stored as an image.

FIG. 1 is a block diagram illustrating a layout of a typical image sensing device.

Referring to FIG. 1, the image sensing device includes a pixel array AR having a plurality of pixels arranged in rows and columns. Using a simplified example for ease of explanation, the pixels of the pixel array AR are arranged in two rows ROW0 to ROW1 and four columns COL0 to COL3. A structure corresponding to each of the columns COL0 to COL3 will be described.

A first column path corresponding to the first column COL0 will be described next.

The first column path includes a first pixel storage unit MIMI0, a first transmission line CL0, a first comparison unit AMP0, a first input line IL0, a first feedback line FL0, a first amplification storage unit MIMO0, a first primary output line OTL0, and a first secondary output line OBL0. The first pixel storage unit MIMI0 stores a first pixel signal outputted from pixels Gr0 and B0 of a first column COL0. The first transmission line CL0 is extended in a column direction and transmits the first pixel signal outputted from the pixels Gr0 and B0 of the first column COL0 to the first pixel storage unit MIMI0. The first comparison unit AMP0 reads the first pixel signal stored in the first pixel storage unit MIMI0 and generates first differential read signals, which are digital signals. The first input line IL0 is extended in the column direction and transmits the first pixel signal stored in the first pixel storage unit MIMI0 to the first comparison unit AMP0. The first feedback line FL0 is extended in parallel with the first input line IL0 and feeds back a first primary read signal of the first differential read signals. The first amplification storage unit MIMO0 stores the first primary read signal. The first primary output line OTL0 is extended in the column direction and transmits the first primary read signal to the first amplification storage unit MIMO0. The first secondary output line OBL0 is extended in parallel with the first primary output line OTL0 and transmits a first secondary read signal of the first differential read signals to an internal circuit (not shown).

The first pixel storage unit MIMI0 is spaced apart from the pixels Gr0 and B0 of the first column COL0 in the column direction. The first comparison unit AMP0 is spaced apart from the first pixel storage unit MIMI0 in the column direction. The first amplification storage unit MIMO0 is spaced apart from the first comparison unit AMP0 in the column direction.

A second column path corresponding to a second column COL1 will be described next.

The second column path includes a second pixel storage unit MIMI1, a second transmission line CL1, a second comparison unit AMP1, a second input line IL1, a second feedback line FL1, a second amplification storage unit MIMO1, a second primary output line OTL1, and a second secondary output line OBL1. The second pixel storage unit MIMI1 stores a second pixel signal outputted from pixels R0 and Gb0 of a second column COL1. The second transmission line CL1 is extended in a column direction and transmits the second pixel signal outputted from the pixels R0 and Gb0 of the second column COL1 to the second pixel storage unit MIMI1. The second comparison unit AMP1 reads the second pixel signal stored in the second pixel storage unit MIMI1 and generates second differential read signals, which are digital signals. The second input line IL1 is extended in the column direction and transmits the second pixel signal stored in the second pixel storage unit MIMI1 to the second comparison unit AMP1. The second feedback line FL1 is extended in parallel with the second input line IL1 and feeds back a second primary read signal of the second differential read signals. The second amplification storage unit MIMO1 stores the second primary read signal. The second primary output line OTL1 is extended in the column direction and transmits the second primary read signal to the second amplification storage unit MIMO1. The second secondary output line OBL1 is extended in parallel with the second primary output line OTL1 and transmits a second secondary read signal of the second differential read signals to an internal circuit (not shown).

The second pixel storage unit MIMI1 is spaced apart from the pixels R0 and Gb0 of the second column COL1 in the column direction. The second comparison unit AMP1 is spaced apart from the second pixel storage unit MIMI1 in the column direction. The second amplification storage unit MIMO1 is spaced apart from the second comparison unit AMP1 in the column direction.

The first pixel storage unit MIMI0 and the second pixel storage unit MIMI1 are disposed in the column direction. The first comparison unit AMP0 and the second comparison unit AMP1 are disposed in a row direction. The first amplification storage unit MIMO0 and the second amplification storage unit MIMO1 are disposed in the column direction.

The disposition order of the first input line IL0 and the first feedback line FL0 is asymmetrical to that of the second input line IL1 and the second feedback line FL1. The disposition order of the first primary output line OTL0 and the first secondary output line OBL0 is asymmetrical to that of the second primary output line OTL1 and the second secondary output line OBL1. For example, the input lines IL0 and IL1 and the corresponding feedback lines FL0 and FL1 are sequentially disposed from the left side of the CMOS image sensing device while the primary output lines OTL0 and OTL1 and the corresponding secondary output lines OBL0 and OBL1 are sequentially disposed from the left side of the CMOS image sensing device.

Next, a third column path corresponding to a third column COL2 is described.

The third column path includes a third pixel storage unit MIMI2, a third transmission line CL2, a third comparison unit AMP2, a third input line IL2, a third feedback line FL2, a third amplification storage unit MIMO2, a third primary output line OTL2, and a third secondary output line OBL2. The third pixel storage unit MIMI2 stores a third pixel signal outputted from pixels Gr1 and B1 of a third column COL2. The third transmission line CL2 is extended in a column direction and transmits the third pixel signal outputted from the pixels Gr1 and B1 of the third column COL2 to the third pixel storage unit MIMI2. The third comparison unit AMP2 reads the third pixel signal stored in the third pixel storage unit MIMI2 and generates third differential read signals which are digital signals. The third input line IL2 is extended in the column direction and transmits the third pixel signal stored in the third pixel storage unit MIMI2 to the third comparison unit AMP2. The third feedback line FL2 is extended in parallel with the third input line IL2 and feeds back a third primary read signal of the third differential read signals. The third amplification storage unit MIMO2 stores the third primary read signal. The third primary output line OTL2 is extended in the column direction and transmits the third primary read signal to the third amplification storage unit MIMO2. The third secondary output line OBL2 is extended in parallel with the third primary output line OTL2 and transmits a third secondary read signal of the third differential read signals to an internal circuit (not shown).

The third pixel storage unit MIMI2 is spaced apart from the pixels Gr1 and B1 of the third column COL2 in the column direction. The third comparison unit AMP2 is spaced apart from the third pixel storage unit MIMI2 in the column direction. The third amplification storage unit MIMO2 is spaced apart from the third comparison unit AMP2 in the column direction.

Hereafter, a fourth column path corresponding to a fourth column COL3 is described.

The fourth column path includes a fourth pixel storage unit MIMI3, a fourth transmission line CL3, a fourth comparison unit AMP3, a fourth input line IL3, a fourth feedback line FL3, a fourth amplification storage unit MIMO3, a fourth primary output line OTL3, and a fourth secondary output line OBL3. The fourth pixel storage unit MIMI3 stores a fourth pixel signal outputted from pixels R1 and Gb1 of a fourth column COL3. The fourth transmission line CL3 is extended in a column direction and transmits the fourth pixel signal outputted from the pixels R1 and Gb1 of the fourth column COL3 to the fourth pixel storage unit MIMI3. The fourth comparison unit AMP3 reads the fourth pixel signal stored in the fourth pixel storage unit MIMI3 and generates fourth differential read signals, which are digital signals. The fourth input line IL3 is extended in the column direction and transmits the fourth pixel signal stored in the fourth pixel storage unit MIMI3 to the fourth comparison unit AMP3. The fourth feedback line FL3 is extended in parallel with the fourth input line IL3 and feeds back a fourth primary read signal of the fourth differential read signals. The fourth amplification storage unit MIMO3 stores the fourth primary read signal. The fourth primary output line OTL3 is extended in the column direction and transmits the fourth primary read signal to the fourth amplification storage unit MIMO3. The fourth secondary output line OBL3 is extended in parallel with the fourth primary output line OTL3 and transmits a fourth secondary read signal of the fourth differential read signals to an internal circuit (not shown).

The fourth pixel storage unit MIMI3 is disposed apart from the pixels R1 and Gb1 of the fourth column COL3 in the column direction. The fourth comparison unit AMP3 is disposed apart from the fourth pixel storage unit MIMI3 in the column direction. The fourth amplification storage unit MIMO3 is disposed apart from the fourth comparison unit AMP3 in the column direction.

The third pixel storage unit MIMI2 and the fourth pixel storage unit MIMI3 are disposed in the column direction. The third comparison unit AMP2 and the fourth comparison unit AMP3 are disposed in a row direction. The third amplification storage unit MIMO2 and the fourth amplification storage unit MIMO3 are disposed in the column direction.

The disposition order of the third input line IL2 and the third feedback line FL2 is asymmetrical to that of the fourth input line IL3 and the fourth feedback line FL3. The disposition order of the third primary output line OTL2 and the third secondary output line OBL2 is asymmetrical to that of the fourth primary output line OTL3 and the fourth secondary output line OBL3. For example, the input lines IL2 and IL3 and the corresponding feedback lines FL2 and FL3 are sequentially disposed from the left side of the CMOS image sensing device, and the primary output lines OTL2 and OTL3 and the corresponding secondary output lines OBL2 and OBL3 are sequentially disposed from the left side of the CMOS image sensing device.

A shielding line SL is extended in the column direction at an interval of two column paths in the image sensing device. In other words, the image sensing device includes a first shielding line SL between the first column path and a column path adjacent to a left side of the first column path (not shown), a second shielding line SL between the second column path and the third column path, and a third shielding line SL between the fourth column path and a column path adjacent to a right side of the fourth column path (not shown).

FIG. 2 is a circuit diagram illustrating in detail the column path described above. FIG. 2 illustrates only the first and second column paths corresponding to the first and second columns COL0 and COL1, respectively.

Referring to FIG. 2, the first column path includes the first pixel storage unit MIMI0, the first comparison unit AMP0, and the first amplification storage unit MIMO0. The first pixel storage unit MIMI0 includes a capacitor, and the first comparison unit AMP0 includes a differential amplifier, while the first amplification storage unit MIMO0 includes a capacitor. The first comparison unit AMP0 outputs first differential read signals Voutp0 and Voutn0 after drawing a comparison between a first ramp signal Vramp0 transmitted through a first standard line RL0 and a first pixel signal Vin0 transmitted through the first input line IL0. The first standard line RL0 is mentioned for a better understanding of the first comparison unit AMP0, but it is not shown in FIG. 1.

The first column path further includes a first feedback unit SW0. The first feedback unit SW0 is coupled between the first feedback line FL0 and the first input line IL0, and the first feedback unit SW0 applies the first primary read signal Voutp0 to the first pixel signal Vin0. The first feedback unit SW0 includes a switch for selectively connecting the first feedback line FL0 to the first input line IL0 in response to a control signal (not shown). The first feedback unit SW0 is described for better understanding of the feedback path, although it is not shown in FIG. 1.

The second column path includes the second pixel storage unit MIMI1, the second comparison unit AMP1, and the second amplification storage unit MIMO1. A description on a structure of the second column path is omitted herein because the structure of the second column path is the same as that of the first column path.

The operation of the image sensing device having the above-described structure will now be described.

The rows of pixels of a pixel array AR are sequentially selected and first to fourth pixel signals Vpx0, Vpx1, Vpx2 and Vpx3 outputted from the pixels of the selected row are transmitted through the first to fourth column paths, respectively. For example, when the first row ROW0 is selected, the first to fourth pixel signals Vpx0, Vpx1, Vpx2 and Vpx3 are outputted from the respective pixels Gr0, R0, Gr1 and R1 of the first row ROW0, and the first to fourth pixel signals Vpx0, Vpx1, Vpx2 and Vpx3 are transmitted through the first to fourth column paths, respectively.

The process of the first to fourth pixel signals Vpx0, Vpx1, Vpx2 and Vpx3 being transmitted through the first to fourth column paths, respectively, is as follows.

The first to fourth pixel storage units MIMI0, MIMI1, MIMI2 and MIMI3 store the first to fourth pixel signals Vpx0, Vpx1, Vpx2 and Vpx3 outputted from the pixel array AR. The first to fourth comparison units AMP0, AMP1, AMP2 and AMP3 generate the first to fourth differential read signals Voutp0 and Voutn0, Voutp1 and Voutn1, Voutp2 and Voutn2, and Voutp3 and Voutn3 in response to the first to fourth pixel signals Vin0, Vin1, Vin2 and Vin3 stored in the first to fourth pixel storage units MIMI0, MIMI1, MIMI2 and MIMI3. The first to fourth amplification storage units MIMO0, MIMO1, MIMO2 and MIMO3 store the first to fourth primary read signals Voutp0, Voutp1, Voutp2 and Voutp3. The first to fourth feedback units SW0, SW1, SW2 and SW3 apply the first to fourth primary read signals Voutp0, Voutp1, Voutp2 and Voutp3 to the first to fourth pixel signals Vin0, Vin1, Vin2 and Vin3 in response to the control signal (not shown).

The first to fourth pixel signals Vpx0, Vpx1, Vpx2 and Vpx3 outputted from the pixel array AR are transmitted to the first to fourth pixel storage units MIMI0, MIMI1, MIMI2 and MIMI3 through the first to fourth transmission lines CL0, CL1, CL2 and CL3. The first to fourth pixel signals Vin0, Vin1, Vin2 and Vin3 stored in the first to fourth pixel storage units MIMI0, MIMI1, MIMI2 and MIMI3 are transmitted to the first to fourth comparison units AMP0, AMP1, AMP2 and AMP3 through the first to fourth input lines IL0, IL1, IL2 and IL3. The first to fourth primary read signals Voutp0, Voutp1, Voutp2 and Voutp3 are transmitted to the first to fourth amplification storage units MIMO0, MIMO1, MIMO2 and MIMO3 through the first to fourth primary output lines OTL0, OTL1, OTL2 and OTL3, and simultaneously to the first to fourth feedback units SW0, SW1, SW2 and SW3 through the first to fourth feedback lines FL0, FL1, FL2 and FL3.

However, the image sensing device having the above-described structure may have the following concerns.

As the size of pixels in a pixel array AR becomes smaller due to technological advances, the pitch between column paths and the pitch between signal lines becomes narrow. This forms a parasitic capacitor and interference between the signal lines, i.e., a coupling effect, occurs. For example, as the first primary read signal Voutp0 and the second pixel signal Vin1 having different dynamic ranges are transmitted through the first feedback line FL0 and the second input line IL1, which are disposed adjacent to each other, a coupling effect occurs. As the first secondary read signal Voutn0 and the second primary read signal Voutp1, having different dynamic ranges, are transmitted through the first secondary output line OBL0 and the second primary output line OTL1, which are disposed adjacent to each other, the coupling effect occurs (refer to FIG. 1). As the pitch between the column paths and the pitch between the signal lines becomes narrow, the extent of the coupling may gradually increase.

The surest way to prevent the signal line coupling is through the shielding line SL. However, there is a limitation in preventing coupling through the shielding line SL because the conditions for forming the shielding line SL are worse as the space becomes narrower.

SUMMARY

Exemplary embodiments of the present invention are directed to an image sensing device having a layout structure in which the interference between column paths is minimized.

In accordance with an embodiment of the present invention, the image sensing device includes a first read unit suitable for generating a first read signal by reading a first pixel signal, a first input line suitable for transmitting the first pixel signal, a first feedback line suitable for feeding back the first read signal, a second read unit disposed adjacent to the first read unit in a same row and suitable for generating a second read signal by reading a second pixel signal, a second input line suitable for transmitting the second pixel signal, and a second feedback line suitable for feeding back the second read signal wherein the first input line and the first feedback line are disposed symmetrically to the second input line and the second feedback line.

In accordance with another embodiment of the present invention, the image sensing device includes a first read unit suitable for generating first differential read signals by reading a first pixel signal, a first primary output line extended in a column direction and suitable for transmitting a first primary read signal of the first differential read signals, a first secondary output line extended in the column direction and suitable for transmitting a first secondary read signal of the first differential read signals, a second read unit disposed adjacent to the first read unit in a row direction and suitable for generating second differential read signals by reading a second pixel signal, a second primary output line extended in the column direction and suitable for transmitting a second primary read signal of the second differential read signals, and a second secondary output line extended in the column line and suitable for transmitting a second secondary read signal of the second differential read signals wherein the first primary output line and the first secondary output line are disposed symmetrically to the second primary output line and the second secondary output line.

In accordance with a further embodiment of the present invention, the image sensing device has a pixel array which includes a plurality of pixels arranged in rows and columns, a first read unit suitable for generating first differential read signals by reading a first pixel signal outputted from pixels of an $N^{th}$ column where N is an integer equal to or greater than 1, a first input line extended in a column direction and suitable for transmitting the first pixel signal, a first feedback line extended in parallel with the first input line and suitable for feeding back a first primary read signal of the first differential read signals, a second read unit disposed adjacent to the first read unit in a row direction and suitable for generating second differential read signals by reading a second pixel signal outputted from pixels of an $(N+2)^{th}$ column, a second input line extended in the column direction and suitable for transmitting the second pixel signal, a second feedback line extended in parallel with the second input line and suitable for feeding back a second primary read signal of the second differential read signals, a third read unit disposed adjacent to the second read unit in the row direction and suitable for generating third differential read signals by reading a third pixel signal outputted from pixels of an $(N+1)^{th}$ column, a third input line extended in the column direction and suitable for transmitting the third pixel signal, a third feedback line extended in parallel with the third input line and suitable for feeding back a third primary read signal of the third differential read signals, a fourth read unit disposed adjacent to the third read unit in the row direction and suitable for generating fourth differential read signals by reading a fourth pixel signal outputted from pixels of an $(N+_3)^{th}$ column, a fourth input line extended in the column direction and suitable for transmitting the fourth pixel signal, and a fourth feedback line extended in parallel with the fourth input line and suitable for feeding back a fourth primary read signal of the fourth differential read signals wherein the first and second feedback lines are disposed highly adjacent to each other in proportion to the first and second input lines, and the third and fourth feedback lines are disposed highly adjacent to each other in proportion to the third and fourth input lines.

DETAILED DESCRIPTION

Figure 1:
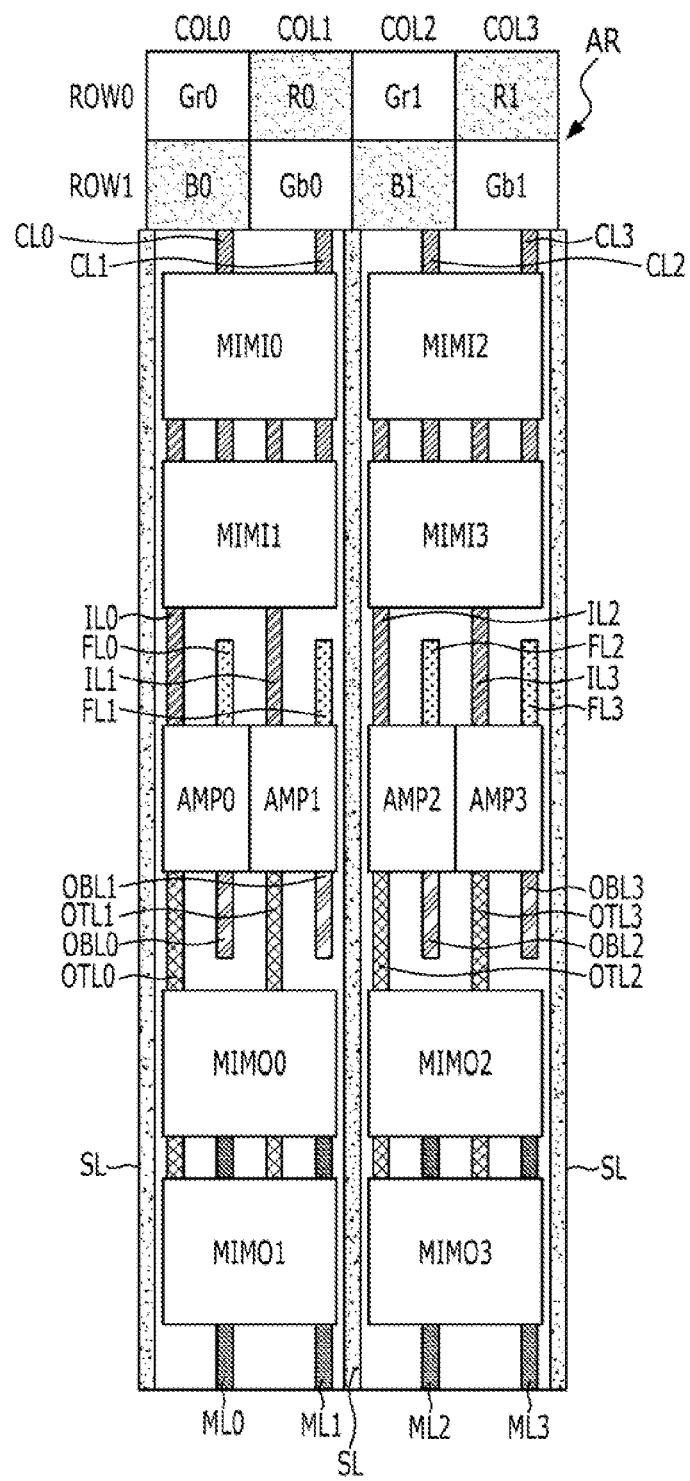
FIG. 1 is a block diagram illustrating a layout of a typical image sensing device.
Figure 2:
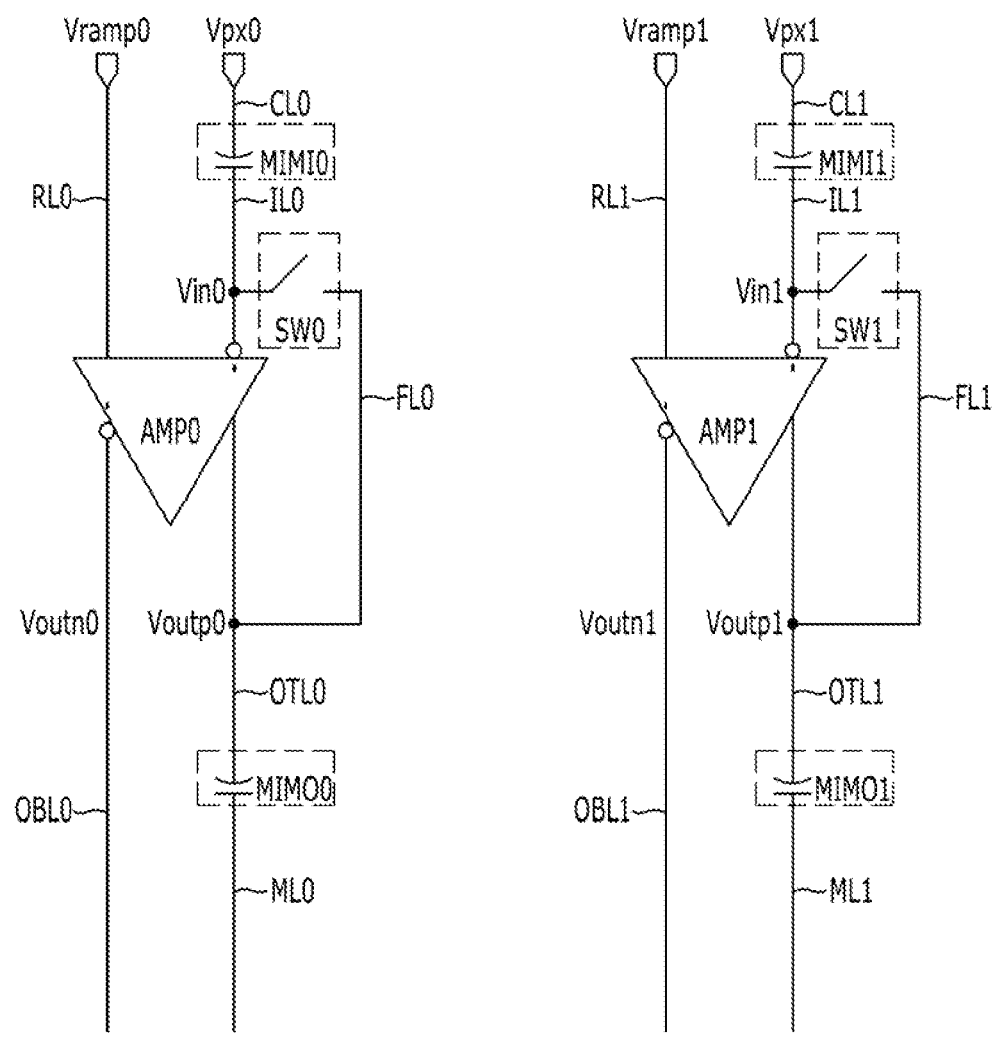
FIG. 2 is a circuit diagram illustrating in detail a first and a second column path shown in FIG. 1.

Exemplary embodiments of the present invention will be described below in more detail with reference to the accompanying drawings. These embodiments are provided so that this disclosure will be thorough and complete and will fully convey the scope of the present invention to those skilled in the art. When describing the present invention, widely-known structures and components irrelevant to the substance of the present invention will be omitted. Throughout the disclosure, like reference numerals refer to like parts throughout the various figures and embodiments of the present invention.

Figure 3:
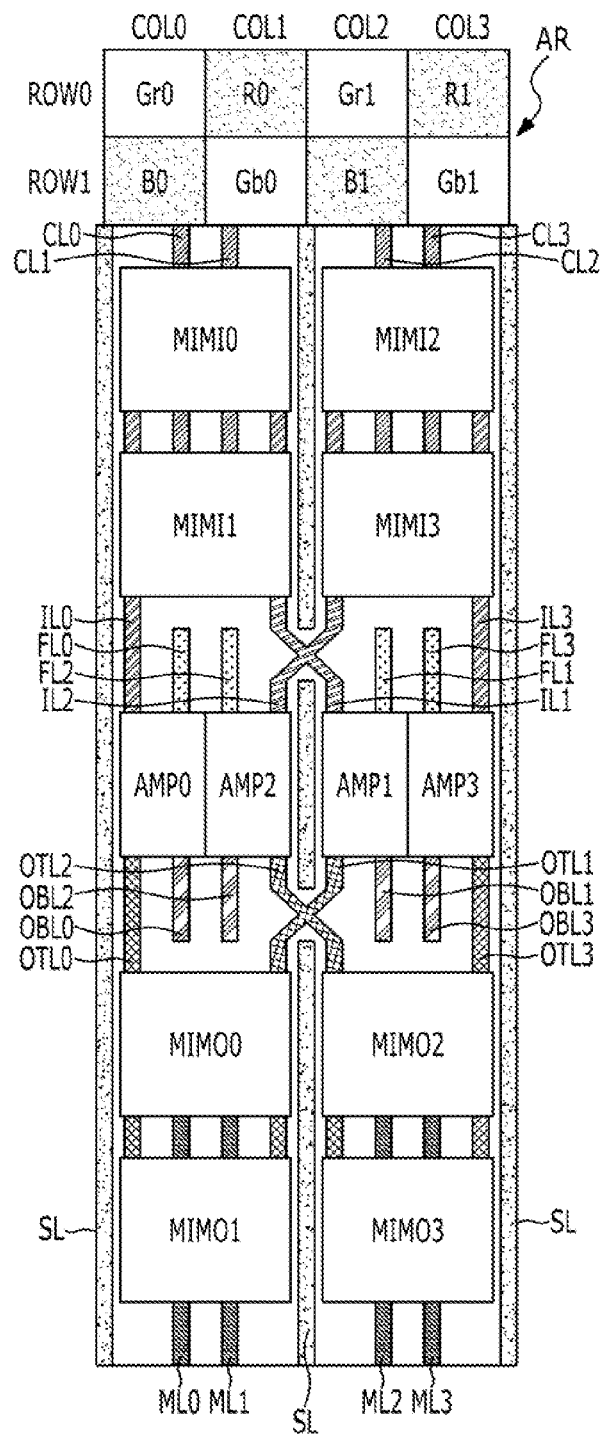
FIG. 3 is a block diagram illustrating a layout of an image sensing device in accordance with an embodiment of the present invention.

FIG. 3 is a block diagram illustrating a layout of an image sensing device in accordance with an embodiment of the present invention.

Referring to FIG. 3, the image sensing device includes a pixel array AR having a plurality of pixels arranged in rows and columns. In a simplified example, pixels of the pixel array AR are arranged into two rows ROW0 to ROW1 and four columns COL0 to COL3. A structure corresponding to each of the columns COL0 to COL3 will now be described.

A first column path corresponding to a first column COL0 will be described first.

The first column path includes a first pixel storage unit MIMI0, a first transmission line CL0, a first comparison unit AMP0, a first input line IL0, a first feedback line FL0, a first amplification storage unit MIMO0, a first primary output line OTL0, and a first secondary output line OBL0. The first pixel storage unit MIMI0 stores a first pixel signal outputted from pixels Gr0 and B0 of a first column COL0. The first transmission line CL0 is extended in a column direction and transmits the first pixel signal outputted from the pixels Gr0 and B0 of the first column COL0 to the first pixel storage unit MIMI0. The first comparison unit AMP0 reads the first pixel signal stored in the first pixel storage unit MIMI0 and generates first differential read signals. The first input line IL0 is extended in the column direction and transmits the first pixel signal stored in the first pixel storage unit MIMI0 to the first comparison unit AMP0. The first feedback line FL0 is extended in parallel with the first input line IL0 and feeds back a first primary read signal of the first differential read signals. The first amplification storage unit MIMO0 stores the first primary read signal. The first primary output line OTL0 is extended in the column direction and transmits the first primary read signal to the first amplification storage unit MIMO0. The first secondary output line OBL0 is extended in parallel with the first primary output line OTL0 and transmits a first secondary read signal of the first differential read signals to an internal circuit (not shown).

The first pixel storage unit MIMI0 is disposed apart from the pixels Gr0 and B0 of the first column COL0 in the column direction. The first comparison unit AMP0 is disposed apart from the first pixel storage unit MIMI0 in the column direction. The first amplification storage unit MIMO0 is disposed apart from the first comparison unit AMP0 in the column direction.

Prior to the description of a second column, a third column path corresponding to a third column COL2 will now be described.

The third column path includes a third pixel storage unit MIMI2, a third transmission line CL2, a third comparison unit AMP2, a third input line IL2, a third feedback line FL2, a third amplification storage unit MIMO2, a third primary output line OTL2, and a third secondary output line OBL2. The third pixel storage unit MIMI2 stores a third pixel signal outputted from pixels Gr1 and B1 of a third column COL2. The third transmission line CL2 is extended in a column direction and transmits the third pixel signal outputted from the pixels Gr1 and B1 of the third column COL2 to the third pixel storage unit MIMI2. The third comparison unit AMP2, disposed adjacent to the first comparison unit AMP0 in the row direction, reads the third pixel signal stored in the third pixel storage unit MIMI2 and generates third differential read signals, which are digital signals. The third input line IL2 is extended in the column direction passing from the third column COL2 to a second column COL1 and transmits the third pixel signal stored in the third pixel storage unit MIMI2 to the third comparison unit AMP2. The third feedback line FL2 is extended in parallel with a part of the third input line IL2 and feeds back a third primary read signal of the third differential read signals. The third amplification storage unit MIMO2 is disposed adjacent to the first amplification storage unit MIMO0 in the row direction and stores the third primary read signal. The third primary output line OTL2 is extended in the column direction passing from the second column COL1 to the third column COL2 and transmits the third primary read signal to the third amplification storage unit MIMO2. The third secondary output line OBL2 is extended in parallel with a part of the third primary output line OTL2 and transmits a third secondary read signal of the third differential read signals to an internal circuit (not shown).

In other words, the third column path is extended along the third column COL2 and is changed to the second column COL1 after passing the third pixel storage unit MIMI2. Then, the third column path is extended along the second column COL1 and is changed to the third column COL2 again after passing the third comparison unit AMP2. Therefore, the third pixel storage unit MIMI2 is disposed apart from the pixels Gr1 and B1 of the third column COL2 in the column direction. The third comparison unit AMP2 is disposed to be spaced apart from a second pixel storage unit MIMI1, which is described below, in the column direction. The third amplification storage unit MIMO2 is disposed apart from a third comparison unit AMP1, which is described below, in the column direction.

The disposition order of the first input line IL0 and the first feedback line FL0 Is symmetrical to the disposition order of the third input line IL2 and the third feedback line FL2. The disposition order of the first primary output line OTL0 and the first secondary output line OBL0 is symmetrical to the disposition order of the third primary output line OTL2 and the third secondary output line OBL2. To be specific, the first and third feedback lines FL0 and FL2 are disposed closer to each other than the first and third input lines IL0 and IL2, and the first and third secondary output lines OBL0 and OBL2 are disposed closer to each other than the first and third primary output lines OTL0 and OTL2.

A second column path corresponding to a second column COL1 will now be described.

The second column path includes a second pixel storage unit MIMI1, a second transmission line CL1, a second comparison unit AMP1, a second input line IL1, a second feedback line FL1, a second amplification storage unit MIMO1, a second primary output line OTL1, and a second secondary output line OBL1. The second pixel storage unit MIMI1 stores a second pixel signal outputted from pixels R0 and Gb0 of a second column COL1. The second transmission line CL1 is extended in a column direction and transmits the second pixel signal outputted from the pixels R0 and Gb0 of the second column COL1 to the second pixel storage unit MIMI1. The second comparison unit AMP1, disposed adjacent to the third comparison unit AMP2 in a row direction, reads the second pixel signal stored in the second pixel storage unit MIMI1 and generates second differential read signals. The second input line IL1 is extended in the column direction, passing from the second column COL1 to a third column COL2, and transmits the second pixel signal stored in the second pixel storage unit MIMI1 to the second comparison unit AMP1. The second feedback line FL1 is extended in parallel with a part of the second input line IL1 and feeds back a second primary read signal of the second differential read signals. The second amplification storage unit MIMO1 is disposed adjacent to the first amplification storage unit MIMO0 in the column direction and stores the second primary read signal. The second primary output line OTL1 is extended in the column direction, passing from the third column COL2 to the second column COL1, and transmits the second primary read signal to the second amplification storage unit MIMO1. The second secondary output line OBL1 is extended in parallel with a part of the second primary output line OTL1 and transmits a second secondary read signal of the second differential read signals to an internal circuit (not shown).

In other words, the second column path is extended along the second column COL1 and is changed to the third column COL2 after passing the second pixel storage unit MIMI1. Then, the third column path is extended along the third column COL2 and is changed to the second column COL1 again after passing the second comparison unit AMP1. Therefore, the second pixel storage unit MIMI1 is disposed apart from the pixels R0 and Gb0 of the second column COL1 in the column direction. The second comparison unit AMP1 is disposed to be spaced apart from the third pixel storage unit MIMI2 in the column direction. The second amplification storage unit MIMO1 is disposed to be spaced apart from the third comparison unit AMP2 in the column direction.

The second and third input lines IL1 and IL2 intersect once while being extended in parallel with each other, and the second and third output lines OTL1 and OTL2 intersect once while being extended in parallel with each other.

Finally, a fourth column path corresponding to a fourth column COL3 will be described.

The fourth column path includes a fourth pixel storage unit MIMI3, a fourth transmission line CL3, a fourth comparison unit AMP3, a fourth input line IL3, a fourth feedback line FL3, a fourth amplification storage unit MIMO3, a fourth primary output line OTL3, and a fourth secondary output line OBL3. The fourth pixel storage unit MIMI3 stores a fourth pixel signal outputted from pixels R1 and Gb1 of a fourth column COL3. The fourth transmission line CL3 is extended in a column direction and transmits the fourth pixel signal outputted from the pixels R1 and Gb1 of the fourth column COL3 to the fourth pixel storage unit MIMI3. The fourth comparison unit AMP3, disposed adjacent to the second comparison unit AMP1 in a row direction, reads the fourth pixel signal stored in the fourth pixel storage unit MIMI3 and generates fourth differential read signals. The fourth input line IL3 is extended in the column direction and transmits the fourth pixel signal stored in the fourth pixel storage unit MIMI3 to the fourth comparison unit AMP3. The fourth feedback line FL3 is extended in parallel with the fourth input line IL3 and feeds back a fourth primary read signal of the fourth differential read signals. The fourth amplification storage unit MIMO3 is disposed adjacent to the second amplification storage unit MIMO1 in the row direction and stores the fourth primary read signal. The fourth primary output line OTL3 is extended in the column direction and transmits the fourth primary read signal to the fourth amplification storage unit MIMO3. The fourth secondary output line OBL3 is extended in parallel with the fourth primary output line OTL3 and transmits a fourth secondary read signal of the fourth differential read signals to an internal circuit (not shown).

The fourth pixel storage unit MIMI3 is disposed apart from the pixels R1 and Gb1 of the fourth column COL3 in the column direction. The fourth comparison unit AMP3 is disposed apart from the fourth pixel storage unit MIMI3 in the column direction. The fourth amplification storage unit MIMO3 is disposed apart from the fourth comparison unit AMP3 in the column direction.

The disposition order of the second input line IL1 and the second feedback line FL1 is symmetrical to the disposition order of the fourth input line IL3 and the fourth feedback line FL3. The disposition order of the second primary output line OTL1 and the second secondary output line OBL1 is symmetrical to the disposition order of the fourth primary output line OTL3 and the fourth secondary output line OBL3. To be specific, the second and fourth feedback lines FL1 and FL3 are disposed closer to each other than the second and fourth input lines IL1 and IL3, and the second and fourth secondary output lines OBL1 and OBL3 are disposed closer to each other than the second and fourth primary output lines OTL1 and OTL3.

Meanwhile, a shielding line SL is extended in the column direction at an interval of two column paths in the image sensing device. In other words, the image sensing device includes a first shielding line SL between the first column path and a column path adjacent to a left side of the first column path (not shown), a second shielding line SL between the second column path and the third column path, and a third shielding line SL between the fourth column path and a column path adjacent to a right side of the fourth column path (not shown). The second shielding line SL between the second column path and the third column path may be formed, corresponding to only a region where the second and third input lines IL1 and IL2 are extended in parallel with each other and a region where the second and third output lines OTL1 and OTL2 are extended in parallel with each other.

Figure 4:
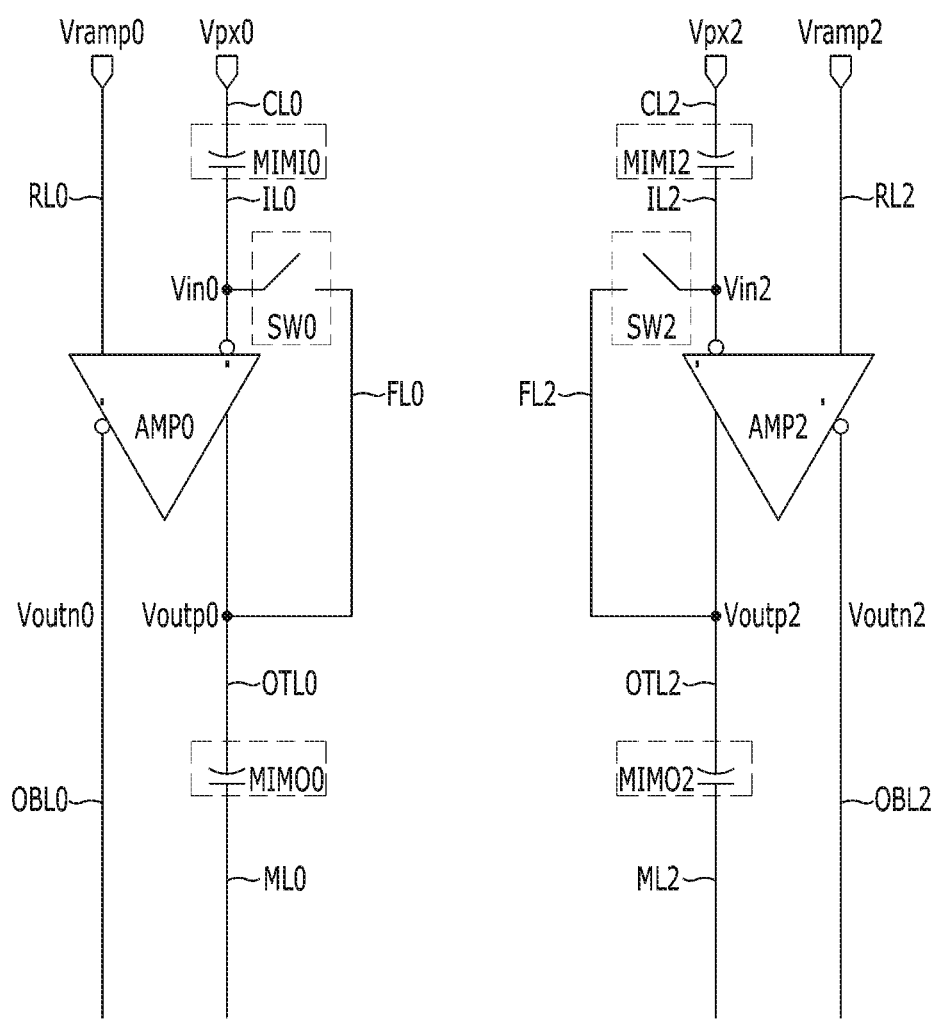
FIG. 4 is a circuit diagram illustrating in detail a first and a second column path shown in FIG. 3.

FIG. 4 is a circuit diagram illustrating in detail the column paths described above. FIG. 4 illustrates only the first and third column paths corresponding to the first and third columns COL0 and COL2, respectively.

Referring to FIG. 4, the first column path includes the first pixel storage unit MIMI0, the first comparison unit AMP0, and the first amplification storage unit MIMO0. The first pixel storage unit MIMI0 includes a capacitor; the first comparison unit AMP0 includes a differential amplifier; and the first amplification storage unit MIMO0 includes a capacitor. The first comparison unit AMP0 outputs first differential read signals Voutp0 and Voutn0 after drawing a comparison between a first ramp signal Vramp0 transmitted through a first standard line RL0 and a first pixel signal Vin0 transmitted through the first input line IL0. The first standard line RL0 is described for better understanding of the first comparison unit AMP0 and is not shown in FIG. 3.

The first column path further includes a first feedback unit SW0. The first feedback unit SW0 is coupled between the first feedback line FL0 and the first input line IL0 and applies the first primary read signal Voutp0 to the first pixel signal Vin0. For example, the first feedback unit SW0 includes a switch for selectively connecting the first feedback line FL0 and the first input line IL0 in response to a control signal (not shown). The first feedback unit SW0 is described for better understanding of the feedback path and is not shown in FIG. 3.

As described above, the third column path includes the third pixel storage unit MIMI2, the third comparison unit AMP2, and the third amplification storage unit MIMO2. A description of the structure of the third column path is omitted since it is the same as that of the first column path. The order of signal lines may be symmetrical, and internal circuits may also be symmetrical in the first and third column paths.

The operation of the image sensing device having the above-described structure will now be described.

The rows of pixels of a pixel array AR are sequentially selected, and first to fourth pixel signals Vpx0, Vpx1, Vpx2 and Vpx3 outputted from the pixels of the selected row are transmitted through the first to fourth column paths, respectively. For example, when the first row ROW0 is selected, the first to fourth pixel signals Vpx0, Vpx1, Vpx2 and Vpx3 are outputted from the respective pixels Gr0, R0, Gr1 and R1 of the first row ROW0, and the first to fourth pixel signals Vpx0, Vpx1, Vpx2 and Vpx3 are transmitted through the first to fourth column paths, respectively.

The process by which the first to fourth pixel signals Vpx0, Vpx1, Vpx2 and Vpx3 are transmitted through the first to fourth column paths is as follows.

The first to fourth pixel storage units MIMI0, MIMI1, MIMI2 and MIMI3 store the first to fourth pixel signals Vpx0, Vpx1, Vpx2 and Vpx3 outputted from the pixel array AR. The first to fourth comparison units AMP0, AMP1, AMP2 and AMP3 generate the first to fourth differential read signals Voutp0 and Voutn0, Voutp1 and Voutn1, Voutp2 and Voutn2, and Voutp3 and Voutn3 in response to the first to fourth pixel signals Vin0, Vin1, Vin2 and Vin3 stored in the first to fourth pixel storage units MIMI0, MIMI1, MIMI2 and MIMI3. The first to fourth amplification storage units MIMO0, MIMO1, MIMO2 and MIMO3 store the first to fourth primary read signals Voutp0, Voutp1, Voutp2 and Voutp3. The first to fourth feedback units SW0, SW1, SW2 and SW3 apply the first to fourth primary read signals Voutp0, Voutp1, Voutp2 and Voutp3 to the first to fourth pixel signals Vin0, Vin1, Vin2 and Vin3 in response to the control signal (not shown).

The first to fourth pixel signals Vpx0, Vpx1, Vpx2 and Vpx3 outputted from the pixel array AR are transmitted to the first to fourth pixel storage units MIMI0, MIMI1, MIMI2 and MIMI3 through the first to fourth transmission lines CL0, CL1, CL2 and CL3. The first to fourth pixel signals Vin0, Vin1, Vin2 and Vin3 stored in the first to fourth pixel storage units MIMI0, MIMI1, MIMI2 and MIMI3 are transmitted to the first to fourth comparison units AMP0, AMP1, AMP2 and AMP3 through the first to fourth input lines IL0, IL1, IL2 and IL3. The first to fourth primary read signals Voutp0, Voutp1, Voutp2 and Voutp3 are transmitted to the first to fourth amplification storage units MIMO0, MIMO1, MIMO2 and MIMO3 through the first to fourth primary output lines OTL0, OTL1, OTL2 and OTL3 and are transmitted simultaneously to the first to fourth feedback units SW0, SW1, SW2 and SW3 through the first to fourth feedback lines FL0, FL1, FL2 and FL3.

The adjacent first and third feedback lines FL0 and FL2 may disable a parasitic capacitor incurred therebetween as the first and third primary read signals Voutp0 and Voutp2 that have similar characteristics are transmitted (refer to FIG. 3). For example, a charge is not stored in a parasitic capacitor formed between the first and third feedback lines FL0 and FL2 as the first and third primary read signals Voutp0 and Voutp2, which are generated from the pixel signals of the same color Gr0 and Gr1, have the same dynamic range. Therefore, a coupling effect does not occur between the first and third feedback lines FL0 and FL2. The coupling effect does not occur between the second and fourth feedback lines FL1 and FL3 because of the same reason as above. Furthermore, as the first and third secondary output lines OBL0 and OBL2 are disposed adjacent to each other, the coupling effect applied to the first and third primary output lines OTL0 and OTL2 is minimized. As the second and fourth secondary output lines OBL1 and OBL3 are disposed adjacent to each other, the coupling effect applied to the second and fourth primary output lines OTL1 and OTL3 is minimized.

In accordance with the embodiments of the present invention, the image sensing device has a structure where the coupling effect between signal lines is minimized and operational reliability of the image sensing device may be improved.

As signal lines having similar characteristics are disposed adjacent to each other, the interference, namely, the coupling effect between the signal lines may be minimized.

While the present invention has been described with respect to specific embodiments, it should be noted that the embodiments are for describing, not limiting, the present invention. Further, it should be noted that the present invention may be achieved in various ways through substitution, change, and modification by those skilled in the art without departing from the scope of the present invention as defined by the following claims.

What is claimed is:

1. An image sensing device, comprising:
   a first comparison unit generating a first read signal by reading a first pixel signal;
   a first input line transmitting the first pixel signal;
   a first feedback line feeding back the first read signal;
   a second comparison unit disposed adjacent to the first comparison unit in a same row and generating a second read signal by reading a second pixel signal;
   a second input line transmitting the second pixel signal;
   a second feedback line feeding back the second read signal,
   a first pixel disposed in a same column as the first comparison unit and generating the first pixel signal; and
   a second pixel disposed in a same row as the first pixel and in a different column from the second comparison unit and generating the second pixel signal,
   wherein the first input line and the first feedback line are disposed symmetrically to the second input line and the second feedback line.

2. The image sensing device of claim 1, wherein the first feedback line and the second feedback line are disposed closer to each other than the first input line and the second input line.

3. The image sensing device of claim 1, wherein the first and second pixel signals include pixel signals of the same color.

4. The image sensing device of claim 1, further comprising:
   a first switch coupled between the first feedback line and the first input line and applying the first read signal to the first pixel signal; and
   a second switch coupled between the second feedback line and the second input line and applying the second read signal to the second pixel signal.

5. The image sensing device of claim 1, wherein the first and second comparison units are symmetrical to each other.

6. The image sensing device of claim 1, wherein the first input line, first feedback line, second input line and second feedback line are extended in a column direction.

7. The image sensing device of claim 1, wherein second comparison unit is extended in a row direction.

8. An image sensing device, comprising:
   a first comparison unit generating first differential read signals by reading a first pixel signal;
   a first primary output line extended in a column direction and transmitting a first primary read signal of the first differential read signals;
   a first secondary output line extended in the column direction and transmitting a first secondary read signal of the first differential read signals;
   a second comparison unit disposed adjacent to the first comparison unit in a row direction and generating second differential read signals by reading a second pixel signal;
   a second primary output line extended in the column direction and transmitting a second primary read signal of the second differential read signals;
   a second secondary output line extended in the column line and transmitting a second secondary read signal of the second differential read signals,
   a first pixel disposed in a same column as the first comparison unit and generating the first pixel signal; and
   a second pixel disposed in a same row as the first pixel and in a different column from the second comparison unit and generating the second pixel signal,
   wherein the first primary output line and the first secondary output line are disposed symmetrically to the second primary output line and the second secondary output line.

9. The image sensing device of claim 8, wherein the first and second secondary output lines are disposed closer to each other than the first and second primary output lines.

10. The image sensing device of claim 8, wherein the first and second pixel signals include pixel signals of the same color.

11. The image sensing device of claim 8, wherein the first and second comparison units are symmetrical to each other.

12. An image sensing device, comprising:
   a pixel array including a plurality of pixels arranged in rows and columns;
   a first comparison unit generating first differential read signals by reading a first pixel signal outputted from pixels of an Nth column, where N is an integer equal to or greater than 1;
   a first input line extended in a column direction and transmitting the first pixel signal;
   a first feedback line extended in parallel with the first input line and feeding back a first primary read signal of the first differential read signals;
   a second comparison unit disposed adjacent to the first comparison unit in a row direction and generating second differential read signals by reading a second pixel signal outputted from pixels of an (N+2)th column;
   a second input line extended in the column direction and transmitting the second pixel signal;
   a second feedback line extended in parallel with the second input line and feeding back a second primary read signal of the second differential read signals;
   a third comparison unit disposed adjacent to the second comparison unit in the row direction and generating third differential read signals by reading a third pixel signal outputted from pixels of an (N+1)th column;
   a third input line extended in the column direction and transmitting the third pixel signal;
   a third feedback line extended in parallel with the third input line and feeding back a third primary read signal of the third differential read signals;
   a fourth comparison unit disposed adjacent to the third comparison unit in the row direction and generating fourth differential read signals by reading a fourth pixel signal outputted from pixels of an (N+3)th column;
   a fourth input line extended in the column direction and transmitting the fourth pixel signal; and
   a fourth feedback line extended in parallel with the fourth input line and feeding back a fourth primary read signal of the fourth differential read signals,
   wherein the first and second feedback lines are disposed adjacent to each other in proportion to the first and second input lines, and the third and fourth feedback lines are disposed adjacent to each other in proportion to the third and fourth input lines.

13. The image sensing device of claim 12, wherein the first comparison unit is disposed corresponding to the pixels of the Nth column, the second comparison unit is disposed corresponding to the pixels of the (N+1)th column, the third comparison unit is disposed corresponding to the pixels of the (N+2)th column, the fourth comparison unit is disposed corresponding to the pixels of the (N+3)th column, the first to fourth input lines are extended in parallel with each other in the column direction, and the second and third input lines intersect once while being extended in parallel with each other in the column direction.

14. The image sensing device of claim 12, wherein the first and second pixel signals include pixel signals of the same color, and the third and fourth pixel signals include pixel signals of the same color.

15. The image sensing device of claim 12, wherein the first and second comparison units are symmetrical to each other, and the third and fourth comparison units are symmetrical to each other.

16. The image sensing device of claim 12, further comprising:
    a first primary output line extended in the column direction and transmitting the first primary read signal;
    a first secondary output line extended in parallel with the first primary output line and transmitting a first secondary read signal of the first differential read signals;
    a second primary output line extended in the column direction and transmitting the second primary read signal;
    a second secondary output line extended in parallel with the second primary output line and transmitting a second secondary read signal of the second differential read signals;
    a third primary output line extended in the column direction and transmitting the third primary read signal;
    a third secondary output line extended in parallel with the third primary output line and transmitting a third secondary read signal of the third differential read signals;
    a fourth primary output line extended in the column direction and transmitting the fourth primary read signal; and
    a fourth secondary output line extended in parallel with the fourth primary output line and transmitting a fourth secondary read signal of the fourth differential read signals,
    wherein the first and second secondary output lines are disposed closer together to each other in proportion to the first and second primary output lines, and the third and fourth secondary output lines are disposed closer together to each other in proportion to the third and fourth primary output lines.

17. The image sensing device of claim 16, wherein the first to fourth primary output lines are extended in parallel with each other in the column direction, and the second and third primary output lines intersect once while being extended in parallel with each other in the column direction.

18. The image sensing device of claim 16, further comprising:
    a shielding line extended in the column line between the second and third input lines and between the second and third primary output lines.

* * * * *